(12) United States Patent
Wang et al.

(10) Patent No.: US 6,795,168 B2
(45) Date of Patent: Sep. 21, 2004

(54) METHOD AND APPARATUS FOR EXPOSING A WAFER USING MULTIPLE MASKS DURING AN INTEGRATED CIRCUIT MANUFACTURING PROCESS

(75) Inventors: Yao-Ting Wang, Atherton, CA (US); Christophe Pierrat, Santa Clara, CA (US); Fang-Cheng Chang, Sunnyvale, CA (US)

(73) Assignee: Numerical Technologies, Inc., Mountain View, CA (US)

(*) Notice: Subject to any disclaimer, the term of this patent is extended or adjusted under 35 U.S.C. 154(b) by 122 days.

(21) Appl. No.: 10/117,838

(22) Filed: Apr. 8, 2002

(65) Prior Publication Data

US 2003/0190762 A1 Oct. 9, 2003

(51) Int. Cl.⁷ .................. G03B 27/54; G03B 27/42; G03B 27/62
(52) U.S. Cl. ................. 355/67; 355/53; 355/75
(58) Field of Search ................. 355/52, 53, 55, 355/67, 71; 356/399–401; 250/548

(56) References Cited

U.S. PATENT DOCUMENTS

| | | | |
|---|---|---|---|
| 4,456,371 A | 6/1984 | Lin | 355/71 |
| 4,624,551 A * | 11/1986 | Anzai et al. | 355/53 |
| 5,418,599 A * | 5/1995 | Kamon | 355/77 |
| 5,539,568 A | 7/1996 | Lin et al. | 359/285 |
| 5,815,248 A | 9/1998 | Nishi et al. | 355/71 |
| 5,815,249 A | 9/1998 | Nishi et al. | 355/71 |
| 5,991,009 A | 11/1999 | Nishi et al. | 355/70 |
| 6,134,008 A * | 10/2000 | Nakao | 356/508 |
| 6,233,044 B1 | 5/2001 | Brueck et al. | 355/67 |
| 6,611,316 B2 * | 8/2003 | Sewell | 355/46 |

FOREIGN PATENT DOCUMENTS

| | | | |
|---|---|---|---|
| EP | 60035516 | * | 2/1985 |
| EP | 60107835 | * | 6/1985 |

OTHER PUBLICATIONS

Starikov, A., "Exposure Monitor Structure", SPIE, Integrated Circuit Metrology, Inspection, and Process Control IV, vol. 1261, pp. 315–325 (1990).
Singh, R., et al., "High–numerical–Aperture Optical Designs", IBM J. Res. Develop., vol. 41, No. 1/2, pp. 39–48, Jan./Mar. 1997.

* cited by examiner

Primary Examiner—Henry Hung Nguyen
(74) Attorney, Agent, or Firm—Park Vaughan & Fleming LLP

(57) ABSTRACT

One embodiment of the invention provides a system that facilitates exposing a wafer through at least two masks during an integrated circuit manufacturing process. The system includes a radiation source and two or more illuminators. Each of these illuminators receives radiation from the radiation source, and uses the radiation to illuminate a reticle holder. The radiation that passes through each reticle holder is then combined in an optical combiner, before passing through an imaging optics, which projects the combined radiation onto a semiconductor wafer.

10 Claims, 3 Drawing Sheets

METHOD AND APPARATUS FOR EXPOSING A WAFER USING MULTIPLE MASKS DURING AN INTEGRATED CIRCUIT MANUFACTURING PROCESS

BACKGROUND

1. Field of the Invention

The invention relates to the process of manufacturing an integrated circuit. More specifically, the invention relates to a method and an apparatus for exposing a wafer using multiple masks during an integrated circuit manufacturing process.

2. Related Art

Integrated circuits can be produced through an optical lithography process that involves creating a mask with a pattern specifying where the various features of the integrated circuit are to be placed and then passing radiation through the mask to expose the pattern on a semiconductor wafer. This pattern defines where the surface of the semiconductor wafer is to be etched or where new material is to be added to create the integrated circuit.

FIG. 1 illustrates the process of exposing a target wafer through a mask. As shown in FIG. 1, radiation emanates from source 102, which can be any suitable source of radiation such as a laser. This radiation passes through illumination optics 104, and then through mask 106, to imaging optics 108. Mask 106 includes the circuit patterns to be projected onto target 110. Imaging optics 108 directs the radiation, including the circuit patterns onto target 110. Target 110 is typically a semiconductor wafer treated to be sensitive to the radiation being used. The above-described process transfers the circuitry delineated on mask 106 to target 110.

As features on integrated circuits become progressively smaller, designers have resorted to splitting the mask into multiple parts so that features can be placed on the separate masks to improve resolution and reduce interference between various features of the circuit and simplify mask manufacturing.

Using multiple masks requires that each of the masks is used to expose the semiconductor wafer. There are several ways that this might be accomplished. One possibility is to use two steppers and to expose the semiconductor wafer through a first mask in the first stepper, and then to expose the semiconductor wafer through a second mask in the second stepper. Since steppers are very expensive—several million dollars each—using two steppers is a very expensive option.

Another possibility is to use two reticle holders within a single stepper, where each reticle holder can be moved into a position where the beam of radiation is passed through the first mask for a first exposure and then passed through the second mask for the second exposure. While this eliminates the expense of having two steppers, changing reticle holders slows the manufacturing process and reduces throughput. Note, the terms "mask" and "reticle" are used interchangeably throughout this application.

What is needed is a method and an apparatus that allow multiple masks to be used for exposing a semiconductor wafer without the problems discussed above.

SUMMARY

One embodiment of the invention provides a system that facilitates exposing a wafer through at least two masks during an integrated circuit manufacturing process. The system includes a radiation source and two or more illuminators. Each of these illuminators receives radiation from the radiation source, and uses the radiation to illuminate a reticle holder. The radiation that passes through each reticle holder is then combined in an optical combiner, before passing through an imaging optics, which projects the combined radiation onto a semiconductor wafer.

In one embodiment of the invention, the radiation source includes two or more sources so that each illuminator receives radiation from a different source.

In one embodiment of the invention, the radiation source includes a beam splitter that splits the radiation from the radiation source into a separate beam for each illuminator.

In one embodiment of the invention, although there are more complex illumination pathways, only a single imaging optics is used for an overall saving. The invention provides improved throughput of wafers in fabrication and better processing control since the time between both exposures and processing is shorter.

In one embodiment of the invention, the system includes a phase shifting device interposed in the path of the radiation in one or more of the illuminators so that the phase of the radiation in one illuminator can be adjusted relative to the phase of the radiation in the other illuminators. Adjusting the relative phase of the radiators may reduce mask fabrication costs as described below.

In one embodiment of the invention, adjusting the phase of the radiation in one illuminator relative to the phase of the radiation in the other illuminators allows splitting a dark field mask that includes 0-degree and 180-degree phase shifters into two dark field binary masks.

In one embodiment of the invention, the system includes adaptive optics at the optical combiner to locally adjust for differences in phase between the illuminators and the objects (masks) at each point within the field.

In one embodiment of the invention, the system includes an optical path-lengthening device interposed in a path of radiation within at least one illuminator. This optical path-lengthening device causes temporal incoherence between the associated illuminator and the other illuminators. Temporal incoherence is useful in cases where only a double exposure is wanted without any phase shift effects.

DETAILED DESCRIPTION

Projecting a Pair of Masks

Figure 1:
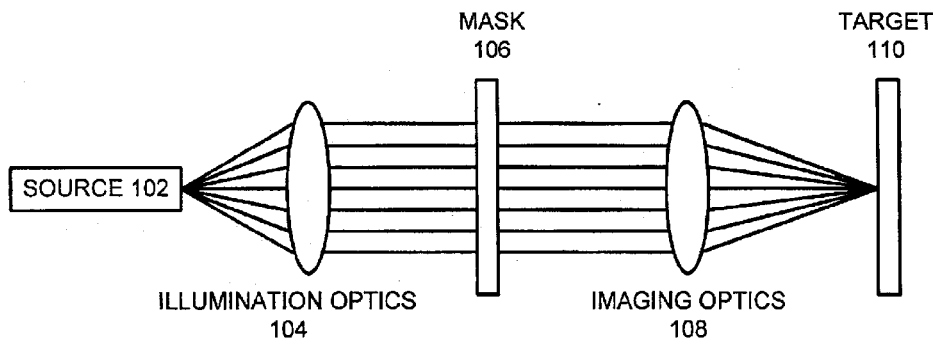
FIG. 1 illustrates the process of exposing a target wafer through a mask.
Figure 2:
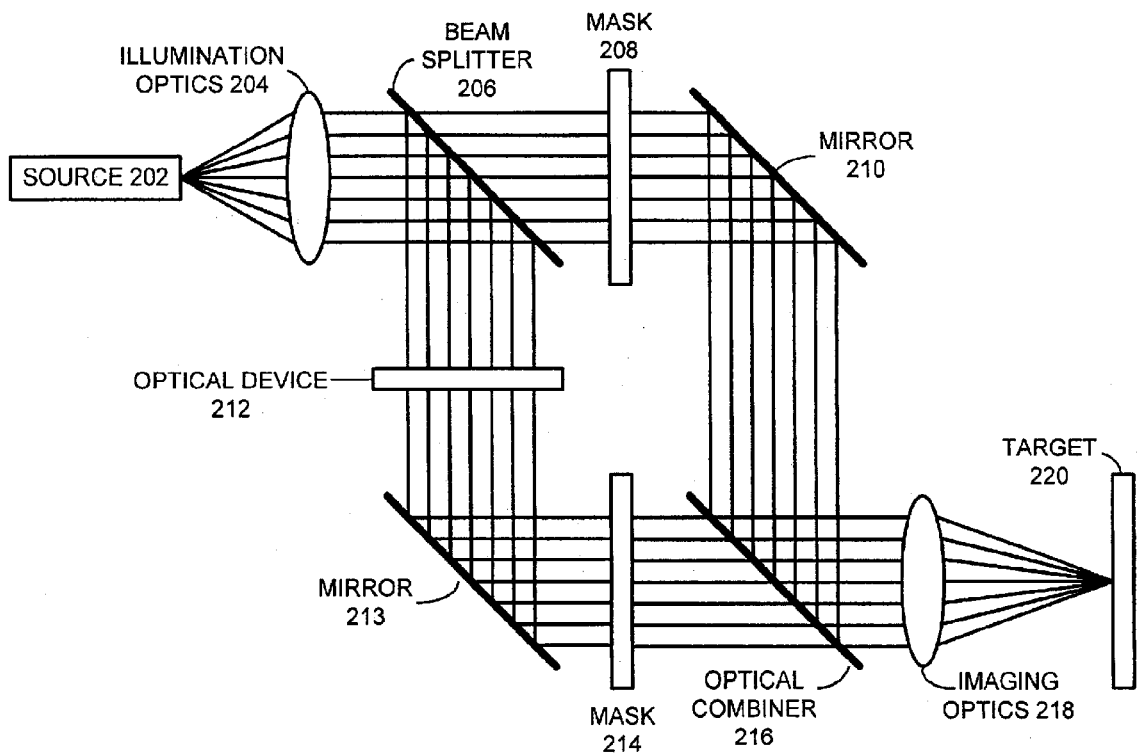
FIG. 2 illustrates projecting an image defined by a pair of masks onto a target in accordance with an embodiment of the invention.

FIG. 2 illustrates projecting an image defined by a pair of masks onto a target in accordance with an embodiment of the invention. Source 202, which can be any suitable source of radiation such as a laser, provides radiation for the system. This radiation passes through illumination optics 204 to beam splitter 206 where the radiation is split into two beams;

a first beam directed toward mask 208 and a second beam directed toward optical device 212. Note that optical device 212 could be placed in the first beam instead of the second beam. Optionally, optical device 212 could be placed after mirror 213 or mirror 210. Note that these optical structures are inside a single stepper/scanner system.

Optical device 212 can perform many functions. Optical device 212 can control the phase delay of the beam to compensate for path differences between illumination optics 204 and imaging optics 218. Optical device 212 can also control the phase of the beam to provide a phase shifted coherent beam at imaging optics 218. Using phase shifted coherent beams allows using two 0-degree dark field masks, with one beam shifted by 180 degrees, in place of a single dark field mask with both 0-degree and 180-degree phase shifts.

Another example where phase shifting in the optical device 212 can be useful is in a four-phase phase-shifting mask. More specifically, a single mask having four-phases can be decomposed into two masks, each having only two phases to manufacture. Optical device 212 can shift the phase in one path by 90 degrees relative to the other path. Optical device 212 can also modify the optical path such that the illuminations of mask 208 and mask 214 are incoherent with respect to each other. This provides the ability to expose target 220 through the separate masks without unwanted interference between the two beams. For example, incoherent illumination is useful for dual exposure AAPSM (one binary mask, one phase shifting mask) and contact arrays (two separate masks so that contacts are partially isolated and can be exposed using attenuated phase shifting masks and low-σ illumination). In an alternate embodiment of the invention, optical device 212 can include a set of optical elements (e.g. adaptive optics) that change the coherence of the light.

After passing through optical device 212, the second beam is reflected from mirror 213 through mask 214 to optical combiner 216. The first beam from beam splitter 206 passes through mask 208 and is reflected by mirror 210 to optical combiner 216. Optical combiner 216 combines the two beams and directs the combined beam to imaging optics 218. In one implementation of the invention, one or more of the mirror 210, mirror 213 and the optical combiner 216 include adaptive optics for adjusting the phase front differences between the masks to compensate for small phase differences between the illumination paths. Note, placement of the adaptive optics on the mirrors is preferred over placement on the optical combiner 216 in some embodiments. Adaptive optics are useful so the overall effects of the illumination are seen identically through two very different paths. One embodiment of adaptive optics includes actuated micromirrors on mirror 210 or mirror 213. An alternative embodiment of adaptive optics includes a deformable mirror on mirror 210 or mirror 213.

Imaging optics 218 then projects the combined beam from optical combiner 216 onto target 220. Target 220 is typically a semiconductor wafer treated to be sensitive to the radiation being used. This process transfers the circuitry delineated on masks 208 and 214 to target 220.

Using Multiple Radiation Sources

Figure 3:
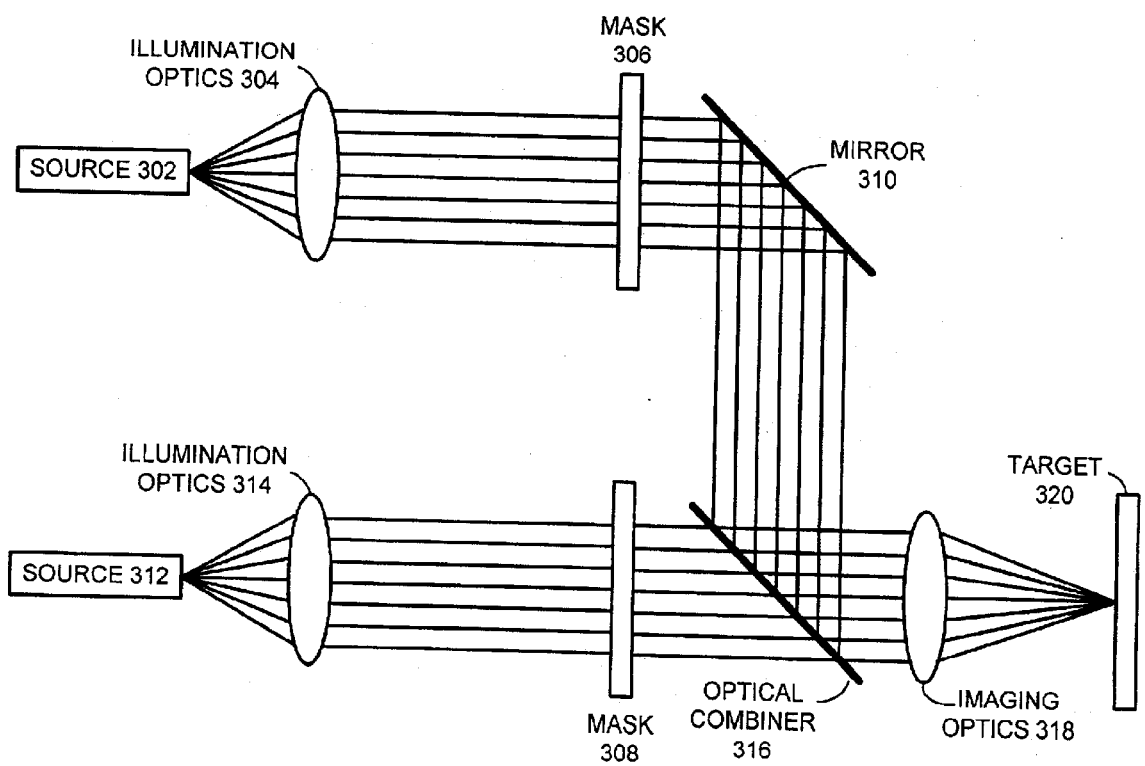
FIG. 3 illustrates projecting an image defined by a pair of masks onto a target using multiple light sources in accordance with an embodiment of the invention.

FIG. 3 illustrates projecting an image defined by a pair of masks onto a target using multiple light sources in accordance with an embodiment of the invention. In this embodiment, radiation is provided by sources 302 and 312. Sources 302 and 312 can be any suitable sources of radiation, such as lasers. Radiation from source 302 passes through illumination optics 304 and mask 306 and is directed by mirror 310 to optical combiner 316, while radiation from source 312 passes through illumination optics 314 and mask 308 and is similarly directed to optical combiner 316. Note that since these radiation sources are separate, the radiation from each source may actually be coherent, but incoherent with respect to the other source. In embodiments with multiple sources, it is possible to use mixtures of incoherent and coherent sources in some embodiments to achieve desired lithographic effects.

The illumination from radiation sources 302 and 312 can include arbitrary spatial frequency components at different strength depending on the source and the spatial filter used for the optics. The exposure process can be a time-sequence, instead of simultaneous exposures, at different exposure doses so as to mimic a variable spatial frequency sweep at different illumination strengths. This is analogous to channel equalization where the signal source is encoded to counter any suppression in the passband Optical combiner 316 combines the beams, which have passed through masks 306 and 308 and directs this combined beam toward imaging optics 318. Imaging optics 318 projects the combined beam onto target 320. Target 320 can include a semiconductor wafer treated to be sensitive to the radiation being used. This process transfers the circuitry delineated on masks 306 and 308 to target 320.

Optical combiner 316 can include adaptive optics to correct for variations in the optical path length and within the optics. Adaptive optics can include movable micromirrors and deformable mirror surfaces.

Projecting the Masks

Figure 4:
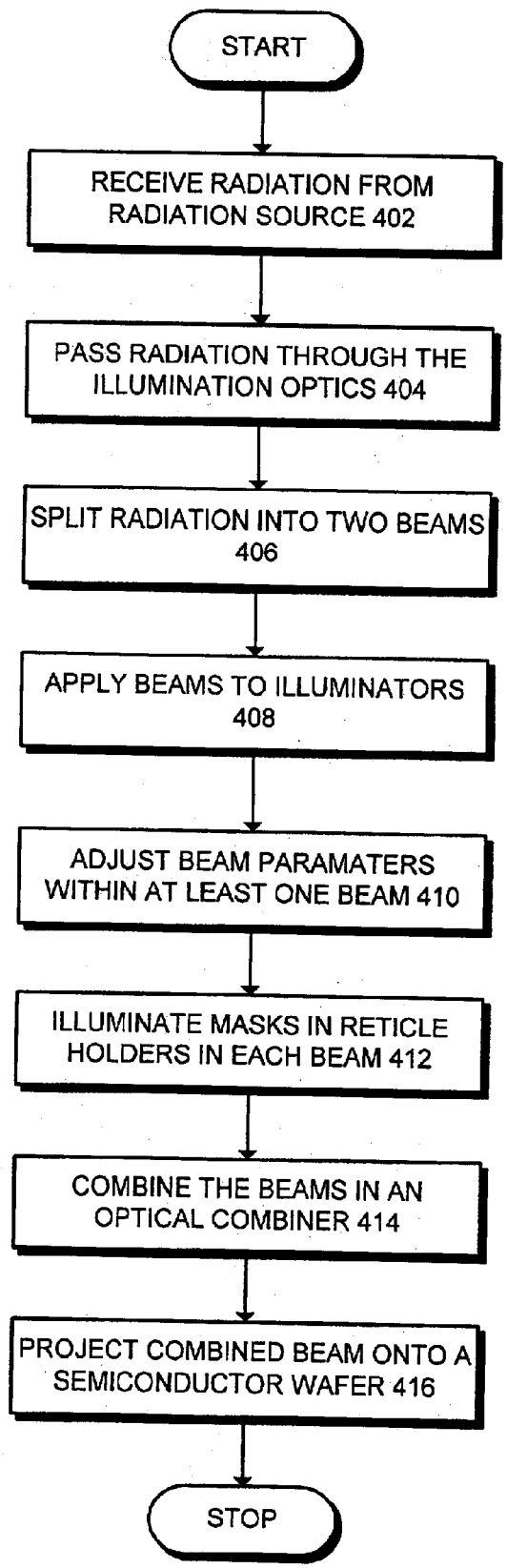
FIG. 4 is a flowchart illustrating the process of projecting an image defined by a pair of masks onto a target in accordance with an embodiment of the invention.

FIG. 4 is a flowchart illustrating the process of projecting an image defined by a pair of masks onto a target in accordance with an embodiment of the invention. The system starts when radiation is received from radiation source 202 (step 402). The radiation from radiation source 202 then passes through illumination optics 204 (step 404). Beam splitter 206 splits the radiation from illumination optics 204 into two beams (step 406). Note that this example uses two beams, however, the system can be designed to use more than two beams and two masks, with appropriate modifications to the illuminators.

Next, the beams are applied to the illuminators so that masks 208 and 214 can be illuminated (step 408). One of these beams is applied through optical device 212. Note that optical device 212 can be interposed in either beam, or an optical device can be interposed in both beams. Optical device 212 then adjusts the beam parameters to achieve a desired effect (step 410). For example, optical device 212 can control the phase delay of the beam to compensate for path differences between illumination optics 204 and imaging optics 218. Optical device 212 can also control the phase of the beam to provide a phase shifted coherent beam at imaging optics 218. Using phase shifted coherent beams allows using two 0-degree dark field masks with one beam shifted by 180 degrees in place of a single dark field mask with both 0-degree and 180-degree phase shifts. Another example where phase shifting can be useful is in a four-color phase shift mask, where only two colors need to be manufactured. Optical device 212 can shift the phase in one path by 90 degrees relative to the other path. Optical device 212 can also lengthen the optical path such that the illuminations of mask 208 and mask 214 are incoherent with respect to each other. This provides the ability to expose target 220 through the separate masks without unwanted interference between the two beams.

Next, one beam from beam splitter 206 illuminates mask 208 while the other beam from beam splitter 206 illuminates mask 214 (step 412). Note that the beam, which illuminates mask 214, is processed by optical device 212 and is then reflected by mirror 213 onto mask 214. The beams pass through masks 208 and 214 and are then directed to optical combiner 216. The beam that passes through mask 208 is reflected by mirror 210 to reach optical combiner 216. Optical combiner 216 combines the beams from masks 208 and 214 into a single beam directed toward imaging optics 218 (step 414).

Finally, imaging optics 218 projects the combined beam onto target 220 (step 416). Target 220 is typically a semiconductor wafer treated to be sensitive to the radiation being used. This process transfers the circuitry delineated on masks 208 and 214 to target 220.

The preceding description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The method of this invention can be performed using the apparatus described in relation to FIGS. 2 and 3. The apparatus can be placed inside a stepper/scanner with appropriate modifications to contain the two or more illuminators.

The foregoing descriptions of embodiments of the invention have been presented for purposes of illustration and description only. They are not intended to be exhaustive or to limit the invention to the forms disclosed. Accordingly, many modifications and variations will be apparent. Additionally, the above disclosure is not intended to limit the invention. The scope of the invention is defined by the appended claims.

What is claimed is:

1. A method to facilitate exposing a wafer through at least two masks during an integrated circuit manufacturing process, comprising:
   receiving radiation from a radiation source, wherein the radiation source includes at least two beams and wherein each beam is applied to an illuminator;
   placing each mask of the at least two masks into a different reticle holder associated with each illuminator;
   adjusting the phase of beams received from each mask using an adaptive optics at the optical combiner, wherein the adaptive optics include one of actuated micromirrors and a deformable mirror, and wherein the adaptive optics can adjust for small differences in phase fronts through the illuminators and the reticles and for variations within the optics;
   combining the at least two beams into a single beam at an optical combiner; and
   projecting the single beam through imaging optics onto a semiconductor wafer;
   whereby a wafer placed on a wafer stage can be exposed by reticles placed in the at least two reticle holders during a single exposure from the radiation source.

2. The method of claim 1, wherein the radiation source includes at least two radiators.

3. The method of claim 1, further comprising splitting the radiation from a single radiator into at least two beams with a beam splitter.

4. The method of claim 3, further comprising adjusting the phase of the radiation in at least one beam.

5. The method of claim 4, wherein adjusting the phase of the radiation in at least one beam allows splitting a dark field mask including 0-degree and 180-degree phase shifters into two dark field masks including only 0-degree phase shifters.

6. The method of claim 4, wherein adjusting the phase of the radiation in at least one beam allows splitting a dark field mask including 0-degree and 180-degree phase shifters into two dark field masks including only 180-degree phase shifters with identical phase shift.

7. The method of claim 4, wherein adjusting the phase of the radiation in at least one beam allows splitting a dark field mask including 0-degree and 180-degree phase shifters into two dark field masks including only phase shifters.

8. The method of claim 3, further comprising interposing an optical path-lengthening device in a path of radiation, wherein the optical path-lengthening device causes temporal incoherence between the at least two beams.

9. The method of claim 1, wherein receiving radiation from the radiation source includes a time-sequenced exposure at different doses, whereby the time-sequenced exposure provides a variable spatial frequency sweep at different illumination strengths analogous to channel equalization to counter any suppression in the passband.

10. A method to improve chip yield during an integrated circuit manufacturing process, comprising:
    receiving radiation from a radiation source, wherein the radiation source includes at least two beams and wherein each beam is applied to an illuminator;
    placing each mask of the at least two masks into a different reticle holder associated with each illuminator;
    adjusting the phase of beams received from each mask using an adaptive optics at the optical combiner, wherein the adaptive optics include one of actuated micromirrors and a deformable mirror, and wherein the adaptive optics can adjust for small differences in phase fronts through the illuminators and the reticles and for variations within the optics;
    combining the at least two beams into a single beam at an optical combiner; and
    projecting the single beam through imaging optics onto a semiconductor wafer;
    whereby a wafer placed on a wafer stage can be exposed by reticles placed in the at least two reticle holders during a single exposure from the radiation source.

* * * * *